(12) United States Patent
Chang

(10) Patent No.: US 6,958,942 B2
(45) Date of Patent: Oct. 25, 2005

(54) CIRCUIT CALIBRATING OUTPUT DRIVING STRENGTH OF DRAM AND METHOD THEREOF

(75) Inventor: Chi Chang, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/914,801

(22) Filed: Aug. 9, 2004

(65) Prior Publication Data

US 2005/0099852 A1    May 12, 2005

(51) Int. Cl.[7] .................................................. G11C 7/00
(52) U.S. Cl. ........................ 365/189.07; 365/189.05; 365/189.11
(58) Field of Search ...................... 365/189.07, 189.05, 365/210

(56) References Cited

U.S. PATENT DOCUMENTS

| | | | |
|---|---|---|---|
| 6,445,316 B1 * | 9/2002 | Hsu et al. | 341/120 |
| 6,885,959 B2 * | 4/2005 | Salmon et al. | 702/107 |
| 6,898,724 B2 * | 5/2005 | Chang | 713/500 |

* cited by examiner

Primary Examiner—Son T. Dinh
(74) Attorney, Agent, or Firm—J.C. Patents

(57) ABSTRACT

A circuit for calibrating the output driving strength of a DRAM and method thereof is provided. A driving strength auto-compensation circuit is used to adjust the resistance value of an output generator inside a memory control chip and match with the target output driving strength of the DRAM. Hence, the input comparator of the memory control chip can be directly used to read from the DRAM and generate an output value so that extra high gain comparators are not required for accurately calibrating the output driving strength of the DRAM. Furthermore, the circuit is easy to implement and the calibrating process can be easily performed.

11 Claims, 3 Drawing Sheets

CIRCUIT CALIBRATING OUTPUT DRIVING STRENGTH OF DRAM AND METHOD THEREOF

CROSS-REFERENCE TO RELATED APPLICATION

This application claims the priority benefit of Taiwan application serial no. 92131036, filed on Nov. 6, 2003.

BACKGROUND OF THE INVENTION

1. Field of the Invention

The present invention relates to a dynamic random access memory (DRAM). More particularly, the present invention relates to a circuit for calibrating the output driving strength of a DRAM and method thereof.

2. Description of Related Art

With rapid progress in electronic technologies, personal computers have become an indispensable product in our offices and homes. In recent years, the data processing capacity and computational speed of computer equipment are increasing at a tremendous pace. As a result, the hardware devices inside each computer have also undergone revolutionary changes. The memory of a computer have progressed from dynamic random access memory (DRAM), double data rate DRAM (DDR DRAM) to second generation double data rate DRAM (DDRII DRAM). To ensure data transmission integrity in the super-fast DDRII DRAM (operating frequency above 400 MHz), a calibrating mechanism is introduced to correct the output driving strength of the DRAM.

FIG. 1 is a diagram showing a conventional DRAM along with its calibration circuit for calibrating the output driving strength of the DRAM. As shown in FIG. 1, a DRAM 120 comprising a pull-up driving output 121, a pull-down driving output 122 and a driving strength adjusting logic circuit 123 for adjusting the pull-up driving output 121 and the pull-down driving output 122 is provided. An output driving strength calibrating circuit 110 comprising a control logic circuit 111, on-die-termination (ODT) resistors 112 and 113 and high-gain comparators 114 and 115 for calibration is provided to perform a calibration of the output driving strength of the pull-up driving output 121 and the pull-down driving output 122. In addition, an output generator 116 for outputting data (D-out) of the memory control chip and an input comparator 117 for inputting data (D-in) but not for calibration are also shown.

In general, the ODT resistors 112 and 113 have a resistance value of about 300 ohms and the pull-up driving output 121 and the pull-down driving output 122 of he DRAM 120 have a resistance value of about 18 plus or minus 4 ohms. In other words, the resistance of the pull-up and pull-down driving output (121 and 122) ranges from 14 to 22 ohms. In the process of calibrating the pull-up driving output 121, the target resistance of the calibrating pull-up driving output 121 is set to 18 ohms. Hence, the reference voltage Voh received by one input terminal of the high gain comparator 114 is set to 300/(300+18)*Vcc. After comparing with another input terminal E (the calibrating pull-up driving output 121 and the ODT resistor 113 together form a voltage divider), a control signal COUNTP is output to the control logic circuit 111. Thereafter, through the driving strength adjusting logic circuit 123, the calibrating pull-up driving output 121 is adjusted. However, the pull-up driving output 121 can have a resistance value of 18 ohms plus or minus 4 ohms and the ODT resistors 112 and 113 can have a resistance value of 300 ohms. Consequently, the detection window of the high gain comparator 114 falls between −4/(300+18) to +4/(300+18) range. Similarly, in the process of calibrating the pull-down driving output 122, the target resistance of the calibrating pull-down driving output 122 is set to 18 ohms. Hence, the reference voltage Vol received by one input terminal of the high gain comparator 115 is set to 18/(300+18)*Vcc. After comparing with another input terminal E (the calibrating pull-down driving output 122 and the ODT resistor 112 together form a voltage divider), a control signal COUNTN is output to the control logic circuit 111. Thereafter, through the driving strength adjusting logic circuit 123, the calibrating pull-down driving output 122 is adjusted. However, the pull-down driving output 122 can have a resistance value of 18 ohms plus or minus 4 ohms and the ODT resistors 112 and 113 can have a resistance value of 300 ohms. Consequently, the detection window of the high gain comparator 115 falls between −4/(300+18) to +4/(300+18) range.

Because the aforementioned output driving strength calibrating circuit 110 uses the ODT resistors 112 and 113 to carry out the adjustment, the detection window is small when the resistance value is large. In other words, very accurate reference voltages Voh and Vol are required to obtain variation of accuracy of about 1%. Hence, the circuit is more difficult to produce. In addition, high gain comparators capable of resolving a voltage differential less than or equal to 1% must be used. Ultimately, overall production cost of the calibrating circuit is increased significantly.

SUMMARY OF THE INVENTION

Accordingly, the present invention is directed to a circuit for calibrating the output driving strength of a dynamic random access memory (DRAM) and method thereof such that no extra high gain comparators is required to provide an accurate adjustment of the output driving strength. Furthermore, the circuit can be easily fabricated and the calibration can be easily performed.

According to an embodiment of the present invention, a circuit for calibrating the output driving strength of a dynamic random access memory is provided. The output driving strength calibration circuit comprises a driving strength auto-compensation circuit, an output adjustment logic circuit, an output generator and an input comparator. The driving strength auto-compensation circuit outputs at least one auto-compensation control signal according to a reference resistance. The output adjustment logic circuit selectively receives and outputs a data output or the auto-compensation control signal. The output generator generates a corresponding calibrated resistance value upon receiving the auto-compensation control signal. An input terminal of the input comparator is connected to a reference voltage terminal and the other input terminal is connected to the output terminal of an output generator and the DRAM. The input comparator generates a compared output value to calibrate the output driving strength of the DRAM.

The reference resistance is a resistor disposed on a main board, for example. The output generator and the input comparator are set up within a north bridge control chip. The output generator comprises a pull-up output controller and a pull-down output controller. The pull-up output controller comprises a plurality of PMOS transistors and the pull-down output controller comprises a plurality of NMOS transistors. The auto-compensation control signal controls the number of conductive PMOS or NMOS transistors to produce a corresponding resistance value. Furthermore, the aforementioned structure may include a control logic circuit for receiving the compare output value and generating a control signal to adjust the output driving strength of the DRAM.

The present invention is also directed to a method of calibrating the output driving strength of a dynamic random access memory (DRAM) through an output generator having a calibration resistance value and an input comparator. An input terminal of the input comparator is connected to a reference voltage while the other input terminal of the input comparator is connected to the DRAM and an output generator. The calibration process includes the following steps. First, the output generator is turned off. Thereafter, the input comparator utilizes the read-out from the DRAM to generate a first output value. If the first output value is a first fixed value, the output driving strength of a pull-down driving output of the DRAM is calibrated. On the other hand, if the first output value is a second fixed value, the output driving strength of a pull-up driving output of the DRAM is calibrated.

The process of calibrating the pull-down driving output of the DRAM further includes the following steps. First, a pull-up output controller of the output generator is rendered conductive. The DRAM read-out of the input comparator is used to generate an second output value. If the second output value is the first fixed value, the output driving strength of the pull-down driving output is decreased until the second output value reaches the second fixed value. On the other hand, if the second output value is the second fixed value, the output driving strength of the pull-down driving output is increased until the second output value reaches the first fixed value.

The process of calibrating the pull-up driving output of the DRAM further includes the following steps. First, a pull-down output controller of the output generator is rendered conductive. The DRAM read-out of the input comparator is used to generate an third output value. If the third output value is equivalent to the second fixed value, the output driving strength of the pull-up driving output is decreased until the third output value reaches the first fixed value. On the other hand, if the third output value is equivalent to the first fixed value, the output driving strength of the pull-up driving output is increased until the third output value reaches the second fixed value.

In short, the present invention is directed to a circuit and a method for calibrating the output driving strength of a DRAM capable of directly using the input comparator of a memory control chip to read the DRAM and generate an output value. Hence, there is no need to deploy extra high gain comparators for accurately adjusting the output driving strength of the DRAM. Moreover, the circuit is easy to fabricate and the adjustment can be performed easily.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
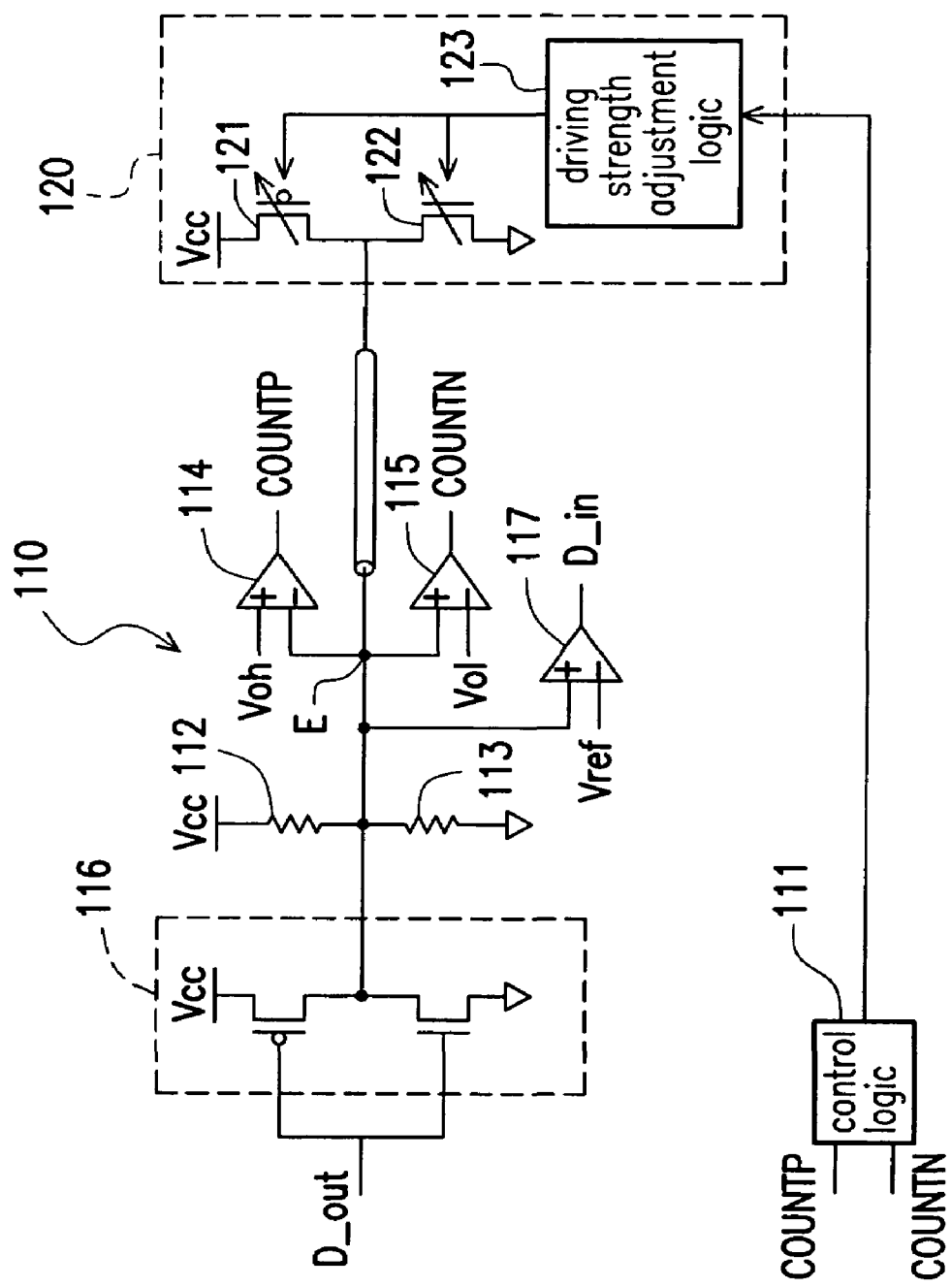
FIG. 1 is a diagram showing a conventional DRAM along with its calibration circuit for calibrating an output driving strength of the DRAM.

Reference will now be made in detail to the present preferred embodiments of the invention, examples of which are illustrated in the accompanying drawings. Wherever possible, the same reference numbers are used in the drawings and the description to refer to the same or like parts.

Figure 2:
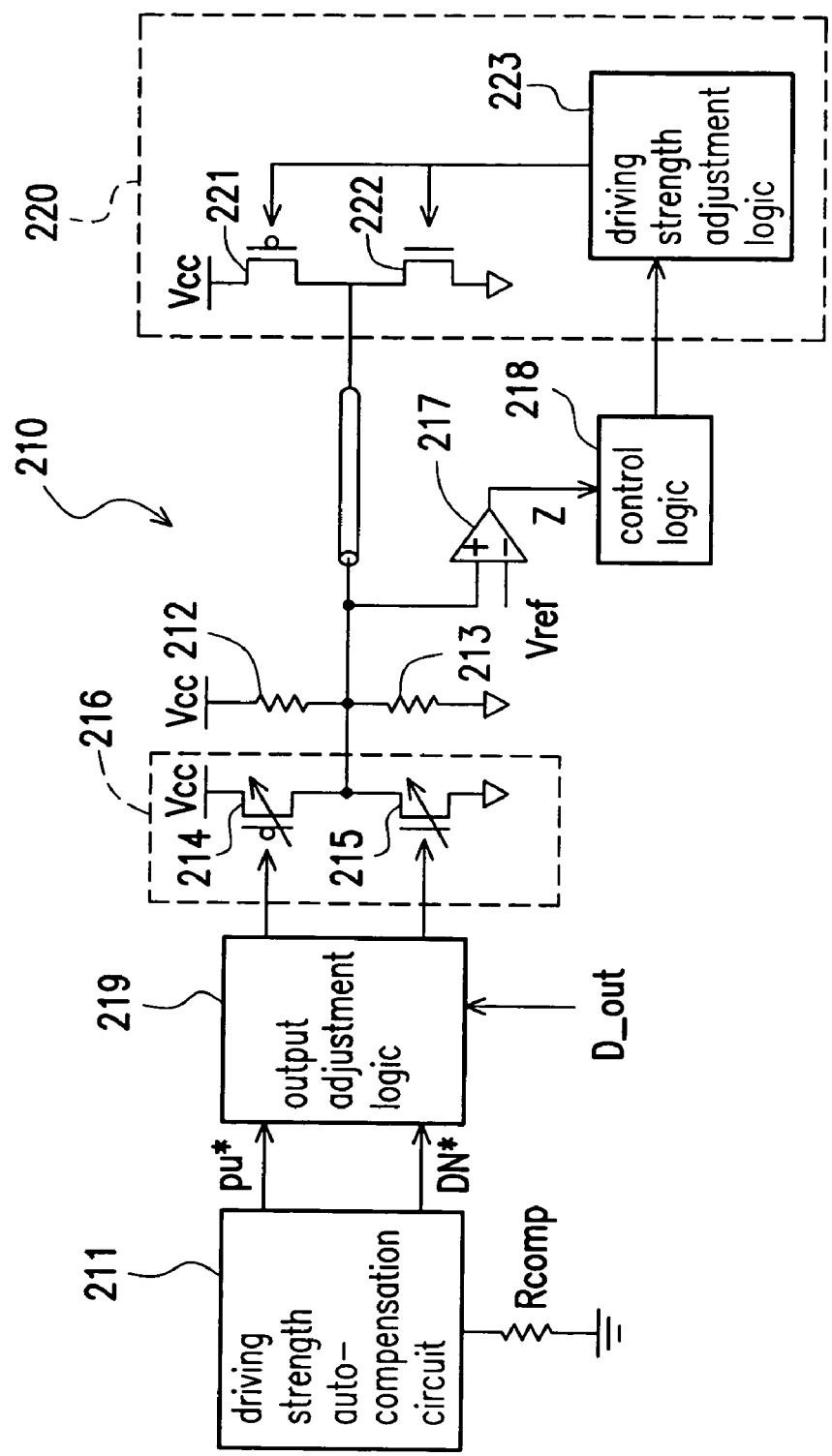
FIG. 2 is a diagram showing a circuit for calibrating the output driving strength of a DRAM according to one embodiment of the present invention.

FIG. 2 is a diagram showing a circuit for calibrating the output driving strength of a DRAM according to one embodiment of the present invention. In FIG. 2, an input comparator 217 for inputting data replaces the original extra high gain comparators 114 and 115 in FIG. 1 in the calibration process. Furthermore, the reference voltage Vref is set to one half of the source voltage Vcc for producing a read-out value Z. Since there is no need to provide two different but highly accurate reference voltages Voh and Vol as shown in FIG. 1, the calibration process can be easily executed. Moreover, elimination the high gain comparators 114 and 115 can significantly reduce the production cost.

As shown in FIG. 2, the output driving strength calibration circuit 210 comprises a driving strength auto-compensation circuit 211, an output adjustment logic circuit 219 and a control logic circuit 218. Together with the output generator 216 and the input comparator 217 of a memory control chip (for example, the north bridge control chip of a control chipset), the output driving strength of the DRAM 220 is calibrated. The DRAM 220 similarly comprises a pull-up driving output 221, a pull-down driving output 222 and a driving strength adjustment logic circuit 223 for adjusting the pull-up driving output 221 and the pull-down driving output 222. In FIG. 2, the on-die-terminal (ODT) resistors 212 and 213 have no action during the calibration process. Hence, the ODT resistors 212 and 213 can be detached from the circuit by a suitable mechanism.

In the present embodiment, the pull-up driving output 221 and the pull-down driving output 222 of the DRAM 220 have a probable resistance of 18 ohms plus or minus 4 ohms. In other words, the resistance falls between 14 ohms to 22 ohms. Thus, an 18 ohm reference resistor Rcomp on the main board can be used to connect with the driving strength auto-compensation circuit 211. The driving strength auto-compensation circuit 211 generates a plurality of auto-compensation control signals PU* and DN* corresponding to the 18 ohms and outputs to an output adjustment logic circuit 219. Through the auto-compensation control signals PU* and DN*, the output adjustment logic circuit 219 controls the conductance of MOS transistors (only one is shown) within the pull-up output controller 214 and MOS transistors (only one is shown) within the pull-down controller 215 of the output generator 216. Thus, the resistance produced by the pull-up output controller 214 and the pull-down output controller 215 of the output generator 216 is adjusted to a value identical to the reference resistance Rcomp. Consequently, the value of the resistance in the pull-up output controller 214 and the pull-down output controller 215 of the output generator 216 are not subjected to any changes in the fabrication process, the source voltage or the temperature.

In addition, the output generator 216 originally served by the data output D_out is now controlled by the output adjustment logic circuit 219. The output adjustment logic circuit 219 controls to switch the calibration process of the pull-up driving output 221 and the pull-down driving output 222 of the DRAM 220 through the pull-up output controller 214 and the pull-down output controller 215 of the output generator 216. Wherein, a switching mechanism of the output adjustment logic circuit 219 for serving outputs data or to execute the calibration processes can be implemented through simple AND gate, NAND gate and OR gates. When the output adjustment logic circuit 219 is switched to a calibrating procedure, the received auto-compensation control signals PU* and DN* are used to control the conductance of the pull-up output controller 214 and the pull-down output controller 215. Hence, the resistance of the pull-up output controller 214 and the pull-down output controller 215 of the output generator 206 can be adjusted. On the contrary, if the output adjustment logic circuit 219 is switched to output data, the output adjustment logic 219 receives the output data D_out to control the pull-up output controller 214 and the pull-down output controller 215 of the output generator 216. Furthermore, the input comparator 217 is also activated to produce an input data (D_in) as shown in FIG. 1.

When the output adjustment logic circuit 219 is switched to a data output mode, the output generator 216 receives the output data D_out, and the input comparator 217 produce an input data. The input comparator 217 also can be used for calibration. In performing a calibration, one of the input terminals of the input comparator 217 is connected to a reference voltage Vref (set to half the source voltage Vcc). The other terminal of the input comparator 217 picks up a voltage provided by a voltage divider between the conductive pull-up output controller 214 and the pull-down driving output 222 or the pull-down output controller 215 and the pull-up driving output 221. Hence, the input comparator 217 generates an output value Z to the control logic 218. The control logic 218 and controls the driving strength adjustment logic circuit 223 inside the DRAM 220. The driving strength adjustment logic circuit 223 calibrates the output driving strength of the pull-up driving output 221 or the pull-down driving output 222 of the DRAM 220. Because the pull-up driving output 221 or the pull-down driving output 222 has an average resistance of 18 plus or minus 4 ohms and the resistance of the pull-up output controller 214 and the pull-down output controller 215 are based on an 18 ohm reference resistor Rcomp, the input comparator 217 permits a detection window ranging between $-4/(18+18)$ to $+4/(18+18)$. Thus, there is a significant increase in the noise tolerance level of the circuit.

Figure 3:
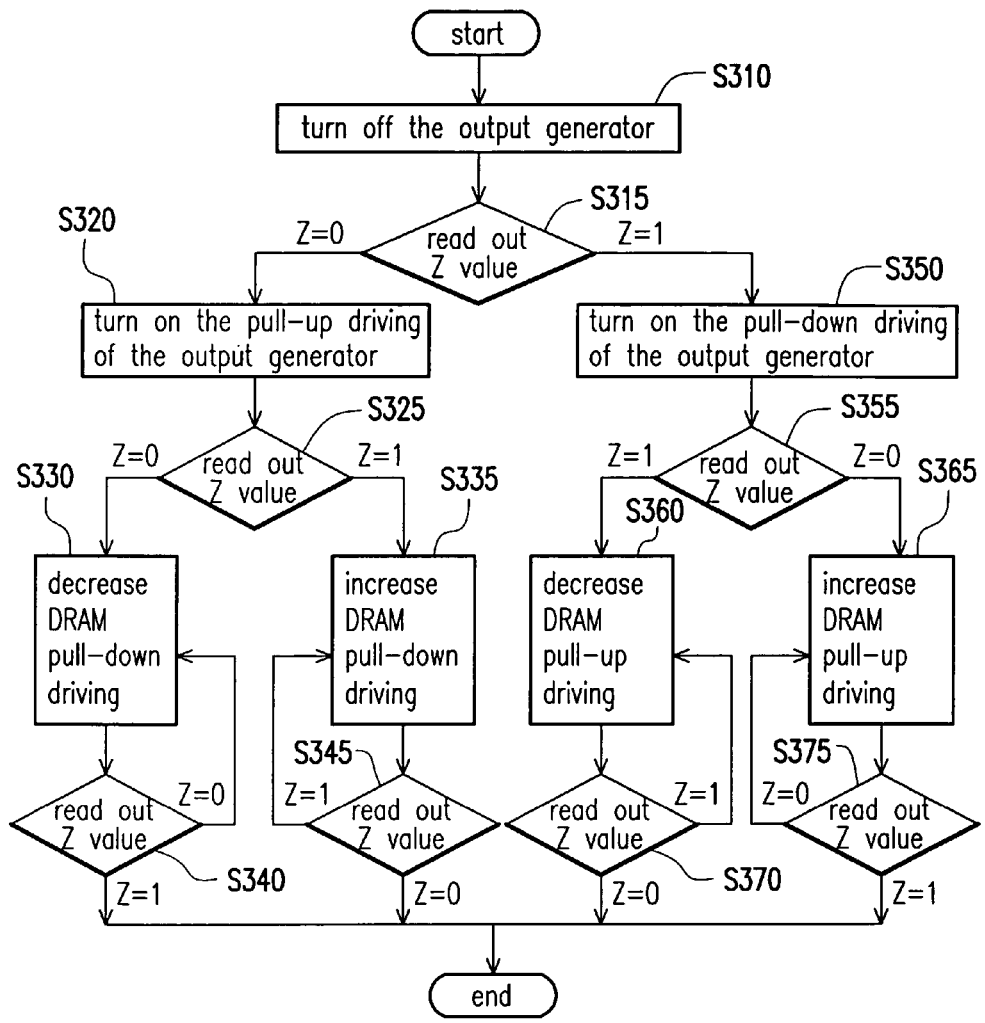
FIG. 3 is a flow diagram showing the steps for calibrating the output driving strength of a DRAM according to one embodiment of the present invention.

FIG. 3 is a flow diagram showing the steps for calibrating the output driving strength of a DRAM according to one embodiment of the present invention. Obviously, before carrying out the calibration, the value of resistance of the pull-up output controller 214 and the pull-down output controller 215 of the output generator 216 has already been adjusted to 18 ohms through the externally connected 18 ohm reference resistor Rcomp.

In step S310, the output adjustment logic circuit 219 is triggered to turn off the pull-up output controller 214 and the pull-down output controller 215 of the output generator 216. In step S315, the input comparator 217 compares the voltage derived from the voltage dividing action between the pull-up driving output 221 and the pull-down driving output 222 of the DRAM 220 and the reference voltage Vref to produce an output value Z.

An output value Z of 0, for example, represents the calibration of the output driving strength of the pull-down driving output 222 inside the DRAM 220 is initialized. At step S320, the conductive pull-up output controller 214 of the output generator 216 acts on the pull-down driving output 222. At step S325, the input comparator 217 generates an output value Z. When the output value Z is 0, the output driving strength of the pull-down driving output 222 of the DRAM 220 is possibly too high so that step S330 is executed. At step S330, through the action of the control logic circuit 218 and the driving strength adjustment logic circuit 223, the output driving strength of the pull-down driving output 222 inside the DRAM 220 is adjusted (decreased). Thereafter, at step S340, the value of Z is read out again. If the output value Z is still 0, step S330 is repeated until the output value Z changes to 1. Ultimately, the output driving strength of the pull-down driving output 222 inside the DRAM 220 is adjusted to the required target value of 18 ohms.

If the output value Z is 1 at step S325, the output driving strength of the pull-down driving output 222 inside the DRAM 220 is possibly too low so that step S335 is executed. In step S335, through the action of the control logic circuit 218 and the driving strength adjustment logic circuit 223, the output driving strength of the pull-down driving output 222 inside the DRAM 220 is adjusted (increased). Thereafter, at step S345, the output value Z is read out again. If the output value Z is still 1, the step S335 is repeated until the output value Z changes to 0. At this stage, the output driving strength of the pull-down driving output 222 inside the DRAM 220 is adjusted to the required target value of 18 ohms.

On the other hand, an output value Z equal to 1 in step S315, for example, represents the calibration of the pull-up driving output 221 inside the DRAM 220 is initialized. In step S350, the pull-down output controller 215 of the output generator 216 acts on the pull-up driving output 221. In step S355, the input comparator 217 generates an output value Z. When the output value Z is 1, the output driving strength of the pull-up driving output 221 of the DRAM 220 is possibly too high so that step S360 is executed. At step S360, the output driving strength of the pull-up driving output 221 inside the DRAM 220 is adjusted (decreased). Thereafter, at step S370, the value of Z is read out again. If the output value Z is still 1, the step S360 is repeated until the output value Z changes to 0. At this stage, the output driving strength of the pull-up driving output 221 inside the DRAM 220 is adjusted to the required target value of 18 ohms.

If the output value Z is 0 in step S355, the output driving strength of the pull-up driving output 221 inside the DRAM 220 is possibly too low so that step S365 is executed. At step S365, the output driving strength of the pull-up driving output 221 inside the DRAM 220 is adjusted (increased). Thereafter, at step S375, the output value Z is read out again. If the output value Z is still 0, the step S365 is repeated until the output value Z changes to 1. At this stage, the output driving strength of the pull-up driving output 221 inside the DRAM 220 is adjusted to the required target value of 18 ohms.

In summary, major advantages of the present invention at least includes:

1. The input comparator inside a memory control chip can be directly used to read out the output value of the DRAM. Since there is no need to secure extra high gain comparators, the circuit is simpler.

2. Because a driving strength auto-compensation circuit is used, the resistance of the pull-up output controller and the pull-down output controller inside the output generator is not affected by any change in fabrication process, source voltage or temperature so that an accurate calibration can be performed.

3. The detection window is raised to a range between −4/(18+18) to +4/(18+18) so that a higher noise level can be tolerated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit, for calibrating the output driving strength of a dynamic random access memory (DRAM), comprising:
    a driving strength auto-compensation circuit, outputting at least one auto-compensation control signal according to a reference resistor;
    an output adjustment logic circuit, for selectively receiving a data output or the auto-compensation control signal and then outputting the data output or the auto-compensation signal accordingly;
    an output generator, for generating a corresponding calibration resistance value when the auto-compensation control signal is received; and
    an input comparator, having an input terminal for receiving a reference voltage and another input terminal connected to the output terminal of the output generator and the DRAM, wherein the input comparator generates a compare output value for calibrating the output driving strength of the DRAM.

2. The circuit of claim 1, wherein the reference resistor comprises a resistor on a main board.

3. The circuit of claim 1, wherein the output generator and the input comparator are located within a north bridge control chip.

4. The circuit of claim 1, wherein the output generator further comprises a pull-up output controller and a pull-down output controller.

5. The circuit of claim 4, wherein the pull-up output controller comprises a plurality of PMOS transistors and the pull-down output controller comprises a plurality of NMOS transistors.

6. The circuit of claim 5, wherein the output generator generates the corresponding calibration resistance value based on the number of conductive PMOS transistors or NMOS transistors controlled by the auto-compensation control signal.

7. The circuit of claim 1, further comprising a control logic circuit for receiving the compare output value and generating a control signal to adjust the output driving strength of the DRAM.

8. A method of calibrating the output driving strength of a dynamic random access memory (DRAM) through an output generator with a calibration resistance value and an input comparator, wherein one input terminal of the input comparator is connected to a reference voltage while another input terminal of the input comparator is connected to the DRAM and the output generator, the method comprising the steps of:
    turning off the output generator;
    generating a first output value according to the read-out obtained from the DRAM by the input comparator;
    calibrating the output driving strength of a pull-down driving output inside the DRAM when the first output value is a first fixed value; and
    calibrating the output driving strength of a pull-up driving output inside the DRAM when the first output value is a second fixed value.

9. The method of claim 8, wherein the first fixed value is logic '0' and the second fixed value is logic '1'.

10. The method of claim 8, wherein the process of calibrating the pull-down driving output of the DRAM further comprises:
    switching the pull-up output controller of the output generator to a conductive mode;
    generating an second output value according to the read-out obtained from the DRAM by the input comparator;
    when the second output value is equivalent to the first fixed value, decreasing the output driving strength of the pull-down driving output inside the DRAM until the second output value is adjusted to the second fixed value; and
    when the second output value is equivalent to the second fixed value, increasing the output driving strength of the pull-down driving output inside the DRAM until the second output value is changed to the first fixed value.

11. The method of claim 8, wherein the process of calibrating the pull-up driving output of the DRAM further comprises:
    switching the pull-down output controller of the output generator to a conductive mode;
    generating an third output value obtained according to the read-out from the DRAM by the input comparator;
    when the third output value is equivalent to the second fixed value, decreasing the output driving strength of the pull-up driving output inside the DRAM until the third output value is adjusted to the first fixed value; and
    when the third output value is equivalent to the first fixed value, increasing the output driving strength of a pull-up driving output inside the DRAM until the third output value is adjusted to the second fixed value.

* * * * *